United States Patent
Reineke et al.

(10) Patent No.: US 6,982,517 B2
(45) Date of Patent: Jan. 3, 2006

(54) CIRCUIT SYSTEM FOR DISCHARGING A BUFFER CAPACITOR USED FOR SUPPLYING HIGH VOLTAGE TO A CONTROL UNIT, IN PARTICULAR A CONTROL UNIT FOR ACTUATING A PIEZOELECTRIC OUTPUT STAGE

(75) Inventors: Joerg Reineke, Ditzingen (DE); Markus Haederle, Gruibingen (DE)

(73) Assignee: Robert Bosch GmbH, Stuttgart (DE)

( * ) Notice: Subject to any disclaimer, the term of this patent is extended or adjusted under 35 U.S.C. 154(b) by 552 days.

(21) Appl. No.: 10/274,695

(22) Filed: Oct. 21, 2002

(65) Prior Publication Data

US 2003/0099071 A1    May 29, 2003

(30) Foreign Application Priority Data

Oct. 20, 2001   (DE)   ............................. 101 52 270

(51) Int. Cl.
*H01L 41/08*   (2006.01)
(52) U.S. Cl. .............................................. 310/316.03
(58) Field of Classification Search ............ 310/316.03
See application file for complete search history.

(56) References Cited

U.S. PATENT DOCUMENTS

| | | | | |
|---|---|---|---|---|
| 4,732,129 A | * | 3/1988 | Takigawa et al. | ............ 123/478 |
| 4,767,959 A | * | 8/1988 | Sakakibara et al. | ......... 310/317 |
| 5,543,679 A | * | 8/1996 | Morino et al. | ......... 310/316.03 |
| 6,111,765 A | * | 8/2000 | Ganser et al. | ................ 363/55 |
| 6,147,433 A | * | 11/2000 | Reineke et al. | ........ 310/316.03 |
| 6,271,618 B1 | * | 8/2001 | Hoffmann et al. | ..... 310/316.03 |
| 6,320,297 B1 | * | 11/2001 | Gurich et al. | .......... 310/316.03 |
| 6,441,535 B2 | * | 8/2002 | Freudenberg et al. | .. 310/316.03 |
| 6,498,418 B2 | * | 12/2002 | Rueger | .................. 310/316.03 |
| 6,617,755 B2 | * | 9/2003 | Kawamoto | ............ 310/316.03 |
| 6,661,285 B1 | * | 12/2003 | Pompei et al. | .............. 330/251 |
| 6,826,504 B2 | * | 11/2004 | Rueger et al. | ............. 702/107 |
| 6,853,114 B2 | * | 2/2005 | Bachmaier et al. | .... 310/316.03 |

FOREIGN PATENT DOCUMENTS

| | | |
|---|---|---|
| DE | 35 25 942 | 1/1987 |
| DE | 41 40 336 | 6/1992 |
| DE | 198 54 789 | 8/1999 |
| DE | 198 27 170 | 12/1999 |
| DE | 196 44 858 | 6/2002 |
| DE | 199 59 716 | 9/2004 |
| JP | 7-325629 | 12/1995 |
| JP | 8-205401 | 8/1996 |
| JP | 8-336281 | 12/1996 |

* cited by examiner

*Primary Examiner*—Mark Budd
(74) *Attorney, Agent, or Firm*—Kenyon & Kenyon

(57) ABSTRACT

A circuit system for discharging a buffer capacitor, in particular for supplying high voltage to a piezoelectric output stage inside a control unit. Electronic switching elements are provided to discharge (but not to recharge) the buffer capacitor after the control unit is isolated from the piezoelectric element or after the control unit is switched off.

13 Claims, 3 Drawing Sheets

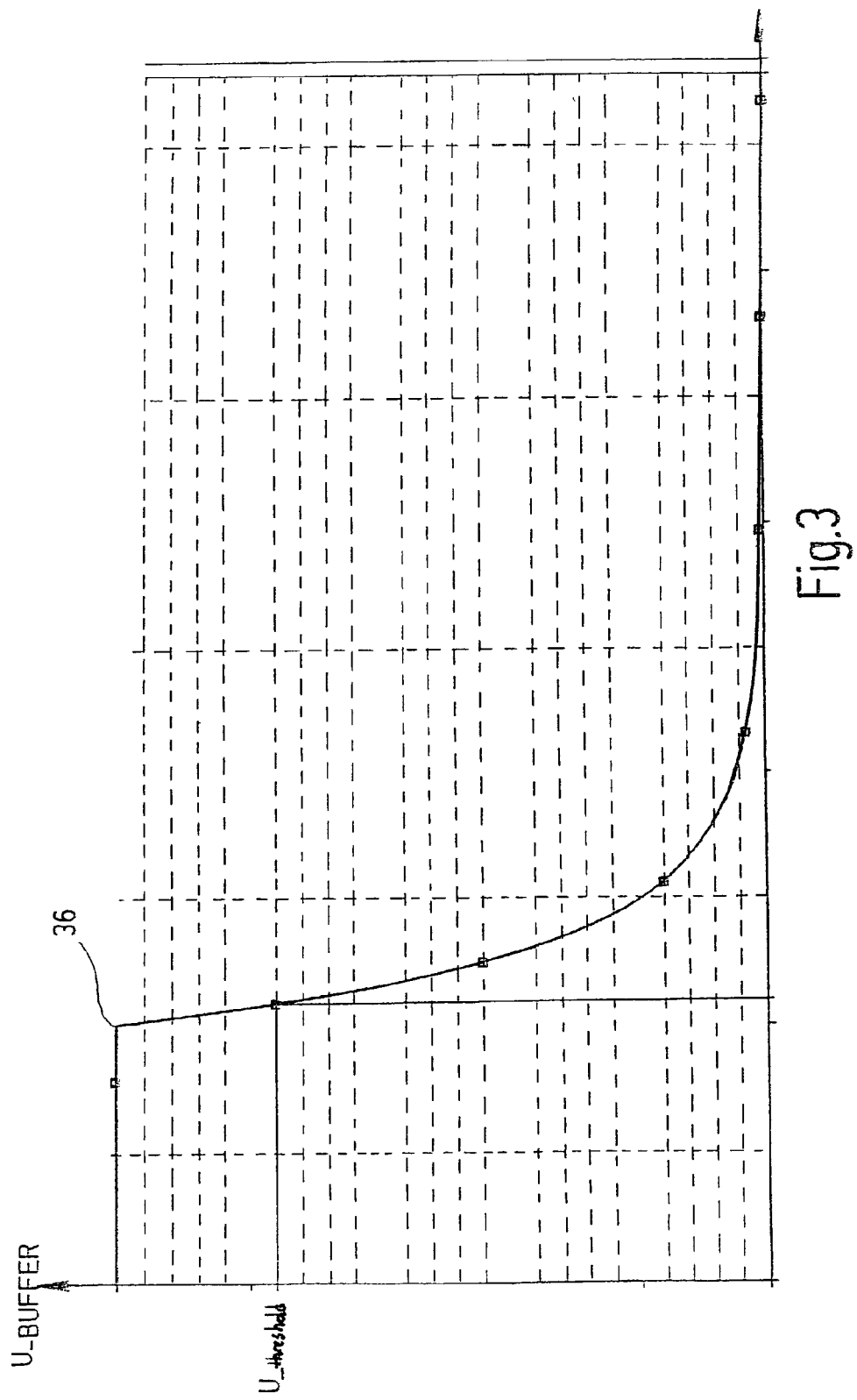

CIRCUIT SYSTEM FOR DISCHARGING A BUFFER CAPACITOR USED FOR SUPPLYING HIGH VOLTAGE TO A CONTROL UNIT, IN PARTICULAR A CONTROL UNIT FOR ACTUATING A PIEZOELECTRIC OUTPUT STAGE

FIELD OF THE INVENTION

The present invention relates to a circuit system for discharging a buffer capacitor, in particular for supplying high voltage to a piezoelectric output stage inside a control unit.

BACKGROUND INFORMATION

Control units may be used for actuating injection systems for motor control in motor vehicles. These control units may precisely control or regulate the injection quantity and the time of injection within an internal combustion engine. Injection systems of motor vehicles may operate via a system having an injection nozzle and a piezoelectric element which may be actuated by the control unit. The control unit may include a triggering device, a high voltage supply, a direct current converter, a buffer capacitor, and a piezoelectric output stage. The buffer capacitor may supply high voltage to the control unit. The control unit may be connected to the engine control via a cable harness plug-in connector. Control units for piezoelectric elements may operate at elevated voltages which may be considerably higher than a safety extra-low voltage. In contrast to previous systems, such elevated voltages in certain cases may represent an increased safety hazard for personnel. For example, high voltage may still be present in the control unit plug-in connector when the cable harness plug-in connector is disconnected and a hardware error is present inside the piezoelectric output stage for the intended actuation of the peripheral piezoelectric element and of the piezoelectric output stage. Also, high voltage may still be present in some components for a certain time when the battery power supply is disconnected or the control unit is switched off. These conditions may result in hazards to personnel if the control unit plug-in connector is touched, in particular when the control unit is opened and several components still carry high voltage.

SUMMARY OF THE INVENTION

According to an exemplary circuit system of the present invention, electronic switching elements may be provided to permit discharge and prevent recharge of a high-voltage buffer capacitor of the piezoelectric output stage after the control unit is separated from the piezoelectric element via disconnection of the cable harness plug-in connector from the control unit plug-in connector or after the control unit is switched off.

In an exemplary embodiment of the present invention, electronic switching elements may be associated with the buffer capacitor inside the circuit system. For example, npn-switching bipolar transistors or MOSFET transistors across which a base-emitter voltage may be established after the cable harness plug-in connector is disconnected or the control unit is switched off. This may result in switching operations in the transistors which may ensure that the buffer capacitor is discharged in a short time. A first transistor may cause the buffer capacitor to discharge, while a second transistor may switch off the triggering device inside the control unit, thus preventing the buffer capacitor from being recharged. This circuit system may represent a safety cutoff for the supply of high voltage to control units, and may significantly reduce the hazard to personnel. The operational safety of systems which include control units having high-voltage piezoelectric output stages and the connected piezoelectric element may be increased using this integrated protective circuit.

BRIEF DESCRIPTION OF THE DRAWINGS

FIG. 3 shows a voltage characteristic curve as a function of time.

DETAILED DESCRIPTION

Figure 1:
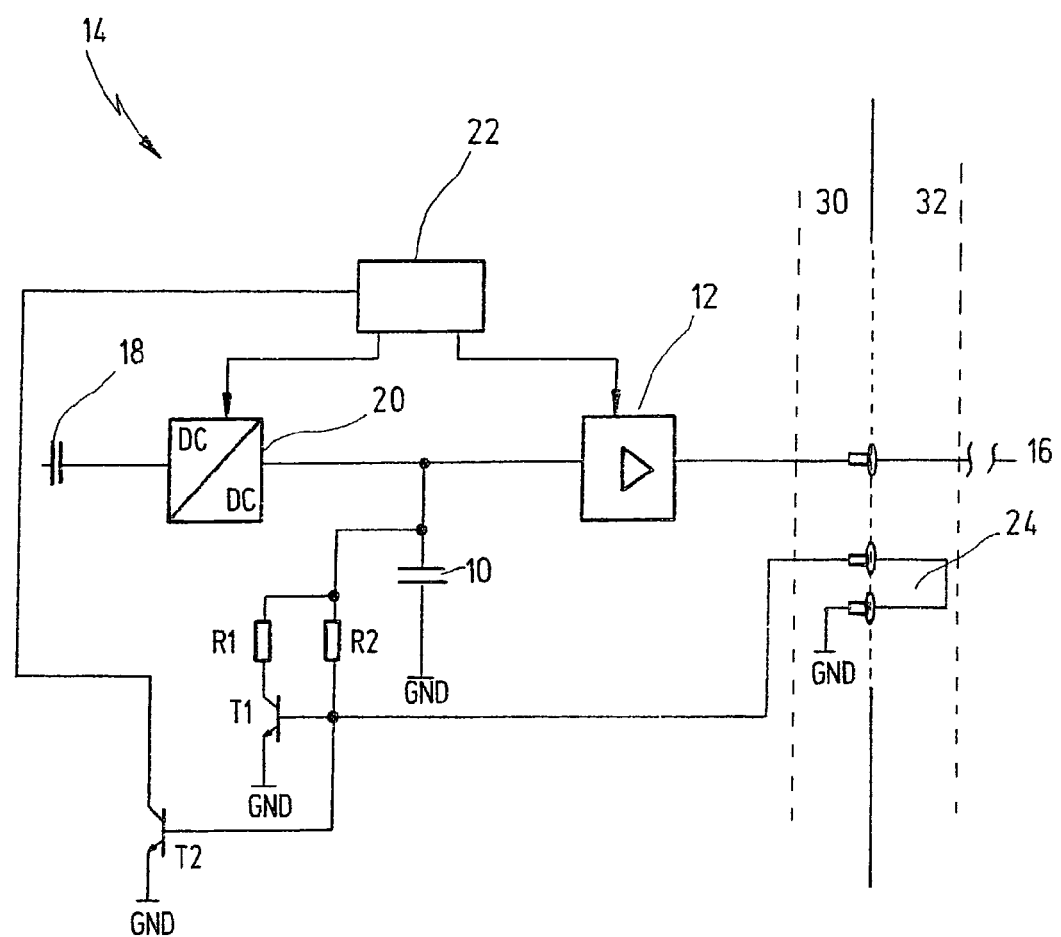
FIG. 1 shows a circuit system in a first exemplary embodiment.

FIG. 1 shows a buffer capacitor 10 which is supplied with high voltage from a voltage source 18 via a direct current converter 20. Buffer capacitor 10 is used in a control unit 14 for supplying high voltage to a piezoelectric output stage 12. Direct current converter 20 and piezoelectric output stage 12 are controlled by a triggering device 22. Piezoelectric elements 16 are connected to piezoelectric output stage 12 via a control unit plug-in connector 30 and a cable harness plug-in connector 32. On the high-voltage side, a resistor R1 and a resistor R2 as well as electronic switching elements T1 and T2 are associated with buffer capacitor 10. Electronic switching elements T1 and T2 may be, for example, npn-switching bipolar transistors or MOSFET transistors. The bases of transistors T1 and T2 are connected to resistor R2 and to ground via a cable harness bridge 24 in control unit plug-in connector/cable harness plug-in connector 30, 32. The collector of electronic switching element T1 is connected to resistor R1, and its emitter side is grounded. The emitter of electronic switching element T2 is likewise connected to ground, but its switching collector output is connected to triggering device 22.

After cable harness plug-in connector 32 is disconnected from control unit plug-in connector 30, the circuit system according to the present invention creates the following function:

In normal operation the bases of transistors T1 and T2 are connected to ground via cable harness bridge 24 in control unit plug-in connector/cable harness plug-in connector 30, 32. Thus, there is no base-emitter voltage U across the bases of transistors T1 and T2, and transistors T1 and T2 are blocked, i.e., non-switching.

When cable harness plug-in connector 32 is disconnected from control unit plug-in connector 30, transistors T1 and T2 become conductive, i.e., are switched on, due to the feature that a base-emitter voltage $U_{\_Buffer}$ arises in buffer capacitor 10 via resistor R2. Switched-on transistor T1 causes buffer capacitor 10 to immediately discharge via resistor R1. Switched-on transistor T2 places triggering device 22 in a reset position, thus preventing buffer capacitor 10 from recharging because direct current converter 20 is not triggered by triggering device 22. The discharge operation in buffer capacitor 10 occurs with a time constant resulting from the resistance of resistor R1 and the buffer capacitance of buffer capacitor 10. Through appropriate dimensioning, the high voltage in buffer capacitor 10 is lowered within a reasonable time period to a value below a safety extra-low voltage $U_{\_threshold}$.

FIG. 3 shows voltage $U_{\_Buffer}$ in buffer capacitor 10 over time. According to an exemplary embodiment of the present invention, the high voltage in buffer capacitor 10 drops to threshold voltage $U_{\_threshold}$ within a short time at the moment that cable harness plug-in connector 32 is disconnected from control unit plug-in connector 30. This threshold voltage $U_{\_threshold}$ is less than or equal to a specified safety extra-low voltage.

Figure 2:
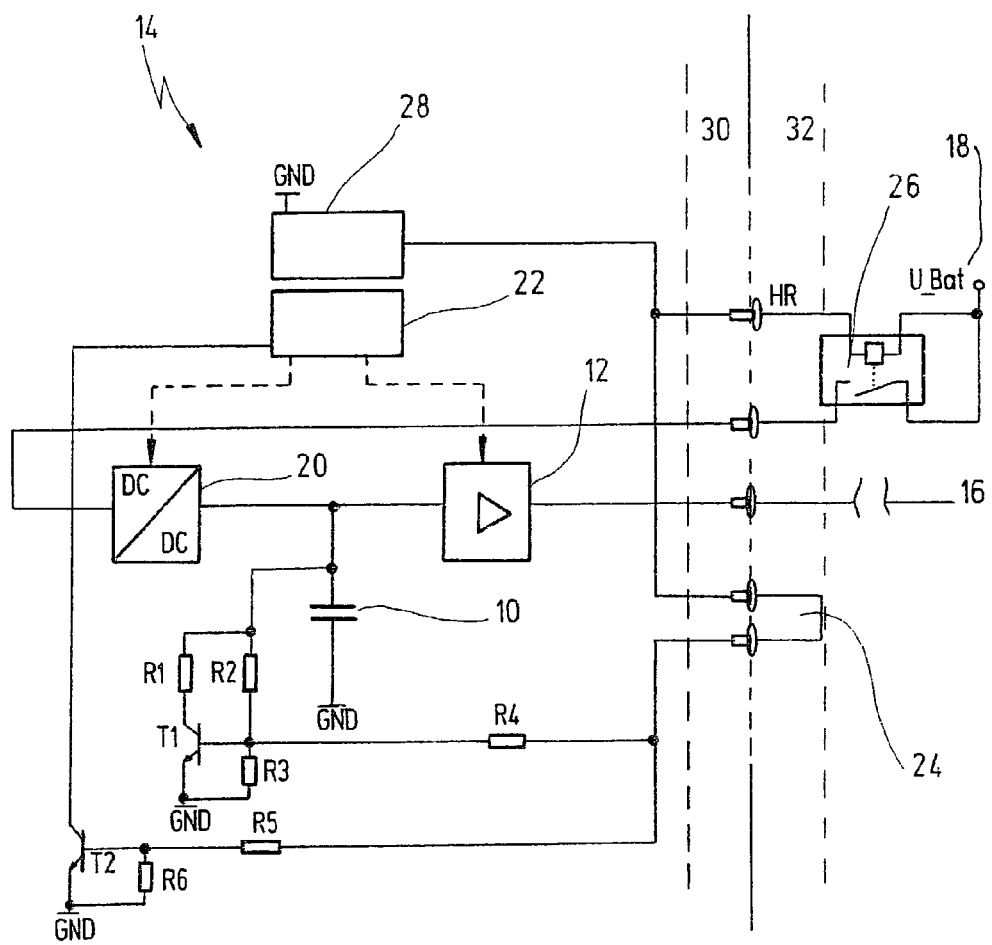
FIG. 2 shows a circuit system in a second exemplary embodiment.

In a second exemplary embodiment according to FIG. 2, disconnection 36 of cable harness plug-in connector 32 from control unit plug-in connector 30 according to the present invention likewise may result in a drop in high voltage $U_{\_Buffer}$ in buffer capacitor 10 to threshold voltage $U_{\_threshold}$. In addition, triggering device 22 is reset. As shown in FIG. 2 for the related circuit system of the second exemplary embodiment, the bases of electronic switching elements T1 and T2 are not connected to ground via cable harness bridge 24, but rather to an output HR of a second triggering device 28 via cable harness bridge 24. A resistor R4 is connected between the base of transistor T1 and cable harness bridge 24, and a resistor R5 is connected between the base of transistor T2 and cable harness bridge 24. In addition, the base of transistor T1 is connected to ground via a resistor R3, and the base of transistor T2 is connected to ground via a resistor R6. Output HR is used in triggering device 28 for triggering a main relay 26. In normal operation, main relay 26 is actuated, i.e., output HR and, via cable harness bridge 24 transistors T1 and T2, are connected to ground via triggering device 28. Thus, no base-emitter voltage U is present across the bases of transistors T1 and T2, and transistors T1 and T2 are blocked, i.e., not turned on.

FIG. 2 also shows, in a manner similar to FIG. 1, buffer capacitor 10 which is supplied with high voltage from voltage source 18 via direct current converter 20. Direct current converter 20 and piezoelectric output stage 12 are triggered by triggering device 22, and piezoelectric elements 16 are connected to piezoelectric output stage 12 via control unit plug-in connector 30 and cable harness plug-in connector 32. On the high-voltage side, resistors R1 and R2 as well as electronic switching elements T1 and T2 are associated with buffer capacitor 10. As in FIG. 1, the bases of transistors T1 and T2 are connected to resistor R2 and, via cable harness bridge 24, to output HR of triggering device 28. The collector-side circuit from transistor T1 to resistor R1 and from transistor T2 to triggering device 22, as well as the emitter-side ground connections of transistors T1 and T2, remain unchanged as in FIG. 1.

If control unit 14 is now externally switched off, triggering device 28 then switches output HR of triggering device 28 to a high resistance. $U_{\_Bat}$ then arises at output HR, resulting in a base-emitter voltage U in transistors T1 and T2 via cable harness bridge 24, and the transistors are turned on, i.e., switched on. Switched-on transistor T1 causes buffer capacitor 10 to immediately discharge via resistor R1. Switched-on transistor T2 resets triggering device 22 in the reset position, thus preventing buffer capacitor 10 from recharging because direct current converter 20 is not triggered by triggering device 22. The discharge operation in buffer capacitor 10 occurs at the same resistance R1 and the same buffer capacitance in buffer capacitor 10, with a resulting discharge time constant.

Illustrated resistors R3 through R6 are used to adjust the operating points of transistors T1 and T2.

On account of cable harness bridge 24, the discharge circuit described in FIG. 2 also operates when cable harness plug-in connector 32 is disconnected from control unit plug-in connector 30. As a result, as described in FIG. 1, a base-emitter voltage $U_{\_Buffer}$ of buffer capacitor 10 arises across resistor R2, and the disconnection operation of the first embodiment, already described according to FIG. 1, occurs. When cable harness plug-in connector 32 is disconnected from control unit plug-in connector 30, and when triggering device 28 is externally switched off, this system may ensure that the high voltage across buffer capacitor 10 is discharged with no recharge of buffer capacitor 10.

What is claimed is:

1. A circuit system for discharging a buffer capacitor, comprising:
   a control unit including a piezoelectric output stage to receive a high voltage from the buffer capacitor; and
   a plurality of electronic elements to permit a discharge of the buffer capacitor and to prevent a recharge of the buffer capacitor after one of the following is satisfied:
   the control unit is isolated from a piezoelectric element; and the control unit is switched off.

2. The circuit system of claim 1, further comprising:
   a direct current converter; and
   a voltage source to supply the high voltage to the piezoelectric output stage via the direct current converter.

3. The circuit system of claim 2, further comprising:
   a first triggering device to trigger the direct current converter and the piezoelectric output stage.

4. The circuit system of claim 2, wherein the buffer capacitor is arranged between the direct current converter and the piezoelectric output stage.

5. The circuit system of claim 1, further comprising:
   a main relay;
   a voltage source to supply the high voltage to the buffer capacitor via the main relay;
   a second triggering device to trigger the main relay; and
   a control unit plug-in connector and a cable harness plug-in connector to connect an output of the second triggering device to the main relay, and to connect the piezoelectric output stage to the piezoelectric element, the cable harness plug-in connector including a cable harness bridge to connect the electronic switching elements to the output of the second triggering device using the control unit plug-in connector.

6. The circuit system of claim 1, wherein the electronic switching elements include a first switching element and a second switching element, and wherein a base-emitter voltage is settable at the first and second switching elements corresponding to switching element characteristic curves.

7. The circuit system of claim 6, further comprising:
   a second resistor to permit an increased buffer voltage of the buffer capacitor.

8. The circuit system of claim 6, wherein a second value of the base-emitter voltage is achievable through a battery voltage.

9. The circuit system of claim 6, further comprising:
   a first resistor associated with the first switching element to form, together with a capacitance of the buffer capacitor, a discharge time constant.

10. The circuit system of claim 8, further comprising:
    a third resistor and a fourth resistor associated with the first switching element to set an operating point of the first switching element.

11. The circuit system of claim 8, further comprising:
    a fifth resistor and a sixth resistor associated with the second switching element to set an operating point of the second switching element.

12. The circuit system of claim 6, wherein the first and second switching elements include npn-switching bipolar transistors.

13. The circuit system of claim of claim 6, wherein the first and second switching elements include MOSFET transistors.

* * * * *